(12) United States Patent
Creasy, Jr. et al.

(10) Patent No.: US 9,674,993 B2
(45) Date of Patent: *Jun. 6, 2017

(54) FLAME RETARDANT, ELECTRICALLY CONDUCTIVE ADHESIVE MATERIALS AND RELATED METHODS

(71) Applicant: Laird Technologies, Inc., Earth City, MO (US)

(72) Inventors: Larry Don Creasy, Jr., St. Clair, MO (US); Alex Hsu, New Taipei (TW); Yishen Lin, New Taipei (TW)

(73) Assignee: Laird Technologies, Inc., Earth City, MO (US)

( * ) Notice: Subject to any disclaimer, the term of this patent is extended or adjusted under 35 U.S.C. 154(b) by 139 days.

This patent is subject to a terminal disclaimer.

(21) Appl. No.: 14/849,912

(22) Filed: Sep. 10, 2015

(65) Prior Publication Data
US 2016/0007509 A1  Jan. 7, 2016

Related U.S. Application Data

(63) Continuation of application No. PCT/CN2013/072621, filed on Mar. 14, 2013.

(51) Int. Cl.
| | |
|---|---|
| *B32B 7/02* | (2006.01) |
| *B32B 7/12* | (2006.01) |
| *B32B 15/04* | (2006.01) |
| *C09K 21/00* | (2006.01) |
| *B29C 65/00* | (2006.01) |

(Continued)

(52) U.S. Cl.
CPC .............. *H05K 9/009* (2013.01); *C08J 7/045* (2013.01); *C09J 7/048* (2013.01); *C09J 9/02* (2013.01); *Y10T 428/24967* (2015.01); *Y10T 428/2848* (2015.01)

(58) Field of Classification Search
None
See application file for complete search history.

(56) References Cited

U.S. PATENT DOCUMENTS

| | | |
|---|---|---|
| 5,736,211 A | 4/1998 | Fontanilla |
| 5,851,663 A | 12/1998 | Parsons et al. |

(Continued)

FOREIGN PATENT DOCUMENTS

| | | |
|---|---|---|
| EP | 2823697 A1 | 1/2015 |
| JP | 2003258480 | 9/2003 |

(Continued)

OTHER PUBLICATIONS

International Search Report and Written Opinion from PCT/CN2013/072621 which is the parent application to the instant application; dated Dec. 26, 2013; 12 pages.

(Continued)

*Primary Examiner* — David Sample
*Assistant Examiner* — Nicole T Gugliotta
(74) *Attorney, Agent, or Firm* — Harness, Dickey & Pierce, P.L.C.

(57) ABSTRACT

Disclosed are exemplary embodiments of a flame retardant, electrically conductive adhesive material. In an exemplary embodiment, a flame retardant, electrically conductive adhesive material suitable for use as tape generally includes a layer of adhesive. A layer of electrically conductive fabric is on the layer of adhesive. A flame retardant coating is on the layer of electrically conductive fabric. The flame retardant coating includes a carbon-containing resin.

15 Claims, 2 Drawing Sheets

(51) Int. Cl.
*H05K 9/00* (2006.01)
*C09J 7/04* (2006.01)
*C08J 7/04* (2006.01)
*C09J 9/02* (2006.01)

(56) References Cited

U.S. PATENT DOCUMENTS

| | | |
|---|---|---|
| 6,022,914 A | 2/2000 | Nowak et al. |
| 6,410,137 B1 | 6/2002 | Bunyan |
| 7,060,348 B2 | 6/2006 | Creasy et al. |
| 7,935,405 B2 | 5/2011 | Sakagawa et al. |
| 8,171,622 B2 | 5/2012 | Zhang |
| 8,545,974 B2 | 10/2013 | Creasy, Jr. |
| 8,884,168 B2 | 11/2014 | Cook et al. |
| 8,968,861 B2 | 3/2015 | Creasy, Jr. et al. |
| 8,999,455 B2 | 4/2015 | Araki |
| 2002/0010223 A1 | 1/2002 | Botrie |
| 2003/0190464 A1 | 10/2003 | Narum et al. |
| 2003/0236362 A1 | 12/2003 | Bluem et al. |
| 2005/0159061 A1 | 7/2005 | Iwaki et al. |
| 2005/0256234 A1 | 11/2005 | Kurumatani et al. |
| 2008/0157915 A1 | 7/2008 | Lin |
| 2009/0068907 A1 | 3/2009 | Sakagawa et al. |
| 2009/0104444 A1 | 4/2009 | Garcia-Ramirez et al. |
| 2014/0069698 A1 | 3/2014 | Choi |

FOREIGN PATENT DOCUMENTS

| | | |
|---|---|---|
| JP | 2005133054 | 5/2005 |
| JP | 2010093077 | 4/2010 |
| KR | 20030096140 | 12/2003 |
| KR | 100898604 | 5/2009 |
| WO | 2006112539 | 10/2006 |
| WO | 2014/139126 | 9/2014 |

OTHER PUBLICATIONS

Korean Office Action dated Oct. 17, 2014 for Korean application No. 10-2014-0030161 which claims priority to the same parent application as the instant application; 5 pages.

Decision of Rejection dated Feb. 13, 2015 for Korean application No. 10-2014-0030161 which claims priority to the same parent application as the instant application; 4 pages.

Korean Office Action dated Apr. 23, 2015 for Korean application No. 10-2014-0030161 which claims priority to the same parent application as the instant application; 5 pages.

Decision of Rejection dated Aug. 21, 2015 for Korean application No. 10-2014-0030161 which claims priority to the same parent application as the instant application; 3 pages.

Taiwan Office Action dated Feb. 17, 2015 for Taiwan application No. 103104864 which claims priority to the same parent application as the instant application; 6 pages.

FLAME RETARDANT, ELECTRICALLY CONDUCTIVE ADHESIVE MATERIALS AND RELATED METHODS

CROSS-REFERENCE TO RELATED APPLICATION

This application is a continuation of PCT International Application No. PCT/CN2013/072621 filed Mar. 14, 2013 (now published as WO 2014/139126). The entire disclosure of the above application is incorporated herein by reference.

FIELD

The present disclosure relates to flame retardant, electrically conductive adhesive materials and related methods.

BACKGROUND

This section provides background information related to the present disclosure which is not necessarily prior art.

The operation of electronic devices generates electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable. A common solution to ameliorate the effects of EMI/RFI is through the use of shields capable of absorbing and/or reflecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to a housing or other enclosure in which electronic equipment is disposed.

SUMMARY

This section provides a general summary of the disclosure, and is not a comprehensive disclosure of its full scope or all of its features.

According to various aspects, exemplary embodiments are disclosed of flame retardant, electrically conductive adhesive materials. In an exemplary embodiment, a flame retardant, electrically conductive adhesive material suitable for use as tape generally includes a layer of adhesive. A layer of electrically conductive fabric is on the layer of adhesive. A flame retardant coating is on the layer of electrically conductive fabric. The flame retardant coating includes a carbon-containing resin.

Exemplary methods of making flame retardant, electrically conductive adhesive materials suitable for use as tape are disclosed. In an exemplary embodiment, a method generally includes coating a first side of a layer of an electrically conductive fabric with a carbon-containing resin coating. The method also includes applying a layer of adhesive to a second side of the layer of electrically conductive fabric.

Also disclosed are exemplary embodiments of flame retardant, electrically conductive tapes. In an exemplary embodiment, a flame retardant, electrically conductive tape having a UL 510 flame rating generally includes an electrically conductive fabric having first and second sides. A flame retardant carbon-containing resin is on the first side of the electrically conductive fabric. An electrically conductive, pressure sensitive adhesive is on the second side of the electrically conductive fabric.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Disclosed herein are exemplary embodiments of flame retardant, electrically conductive adhesive materials that are suitable for use as tape. In exemplary embodiment, a flame retardant, electrically conductive adhesive material generally include a layer of electrically conductive fabric on which is provided (e.g., laminated, etc.) a layer of pressure sensitive adhesive (PSA). In some embodiments, the PSA layer includes one or more flame retardants (FRs). The inventors hereof have recognized that it would be beneficial to reduce or eliminate amounts of flame retardant contained in PSAs, while still providing a desired level of flame retardance to the material. Accordingly, the inventors have developed and disclose herein exemplary embodiments of flame retardant, electrically conductive adhesive materials and related methods.

Figure 1:
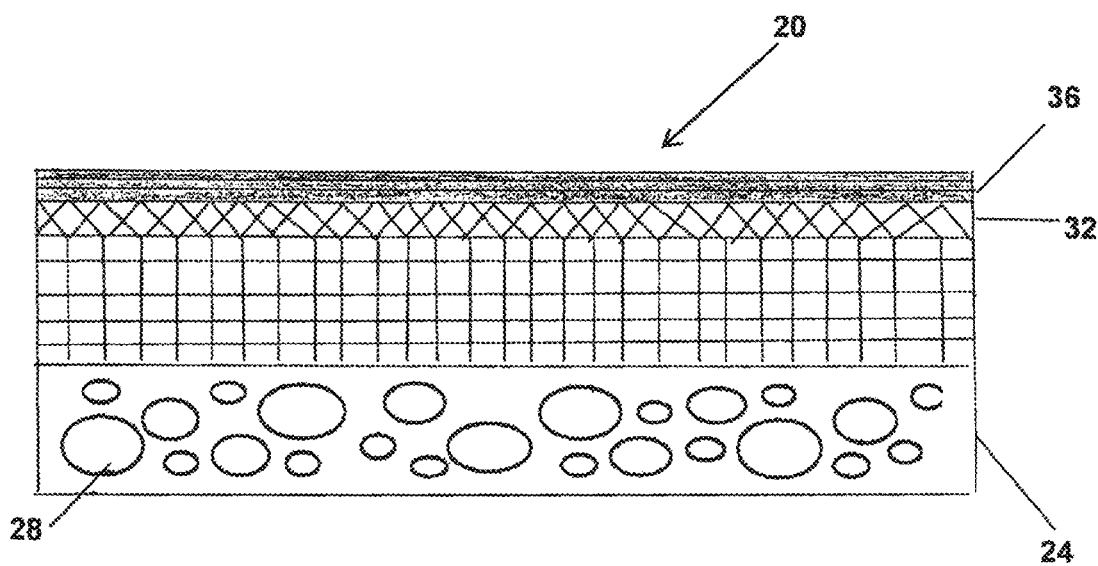
FIG. 1 is a schematic of an exemplary embodiment of a flame retardant, electrically conductive adhesive material.

With reference now to the figures, FIG. 1 illustrates an exemplary embodiment of a flame retardant, electrically conductive pressure sensitive adhesive material 20 embodying one or more aspects of the present disclosure. In various embodiments, the adhesive material 20 may advantageously offer electrically-conductive properties together with resistance to fire or flame retardance without using (or using very little) halogen-based substances (e.g., bromines, chlorines, etc.). With these qualities, the adhesive material 20 may thus be suitable for use as tape, e.g., in relation to electromagnetic interference (EMI) shielding devices that are common in computers, personal digital assistants, cell phones, and other electronic devices.

As shown in FIG. 1, the adhesive material 20 generally includes an adhesive layer 24. In the present example, the adhesive 24 is an electrically conductive pressure sensitive adhesive (CPSA) having electrically conductive particles 28. Alternative embodiments may include an adhesive that is not electrically conductive. Further embodiments may be provided in which an adhesive is not pressure sensitive.

With continued reference to FIG. 1, an electrically conductive fabric layer 32 is provided on and/or coupled to the adhesive layer 24. For example, the adhesive layer 24 may be laminated onto the fabric 32. A flame retardant coating 36 is provided on the electrically conductive fabric 32, e.g., as further described below. In various aspects, the coating 36 is or includes a carbon-containing resin.

A wide range of materials may be used for the adhesive 24, including adhesive materials that are acrylate-based, rubber-based, silicone polymer based, etc. In some embodiments, cross-linking may occur during an aging process as well as during a drying process. As one example, the adhesive 24 includes an acrylate-based material, which is converted from monomer (e.g., methyl acrylate, ethyl acrylate, butyl acrylate, isooctyl acrylate, acrylonitrile, etc.) into an oligomer or polymer. In this particular example, a drying process can be used for solvent evaporation. During the drying process, relatively minor cross-linking (but not really synthesis) may occur for some function groups of the polymer/oligomer. Most cross-linking, however, may occur after drying. For example, some embodiments include additional aging for a few days (e.g., one to fourteen days for some embodiments, etc.) such that most cross-linking is reacted during the aging process and not the drying process.

By way of further examples, the adhesive 24 may include a synthetic or natural rubber, styrene butadiene rubber, styrene isoprene styrene rubber, silicone rubber, or an elastomer, or other resin, plastic, or polymer exhibiting rubber-like properties of compliancy, resiliency or compression deflection, low compression set, flexibility, and an ability to recover after deformation. The adhesive 24 is shown in FIG. 1 in a substantially solid form. Prior to formation of the layer 24, the adhesive 24 may be provided in a substantially liquid form for receiving additives such as the electrically conductive particles 28, etc. In various aspects, the coating 36 provides sufficient flame retardance such that flame retardant can be omitted from the adhesive layer 24. In some embodiments, at least some level of flame retardant may still be provided or included in the adhesive layer 24.

The electrically conductive particles 28 of the adhesive 24 may include any of a wide range of suitable materials, including but not limited to electrically conductive nickel powder. In some embodiments, nickel powder may be processed as necessary to the desired particle size and then added to the adhesive 24. In other embodiments, nickel powder may not need to be processed to obtain a desirable particle size. Nickel particles in various embodiments may have an average particle size of between about 0.0005 millimeters to about 0.1 millimeters and/or have a range of particle sizes between about 0.0001 millimeters to about 0.2 millimeters. In other exemplary embodiments, the particles 28 may include, for example, copper powder, graphite, silver powder, silver coated copper powder, silver coated glass powder, nickel coated graphite, or other conductive powder, other metals, alloys thereof, etc. Additional embodiments may have electrically conductive particles having an average particle size less than 0.2 millimeters. In still other exemplary embodiments, the electrically conductive material may have particles with sizes larger than 0.2 millimeters or smaller than 0.0001 millimeter.

The fabric layer 32 may function as a backing layer and may include a metallized, electrically-conductive fabric. The metal forming the fabric 32 may be copper, nickel, silver, palladium aluminum, tin, alloys, and/or combinations thereof. The fabric layer 32 may also include a metal mesh or a metal-plated fabric. In some embodiments, the adhesive 24 mixture is preferably applied to the fabric 32 by a lamination process using a twin-roll type laminator to immerse the adhesive 24 mixture in the fabric 32. The temperature and pressures used for the lamination process may vary depending, for example, on the particular materials used. The adhesive 24 mixture may be dried in an oven to evaporate the liquid carrier of the adhesive 24. In some embodiments, an additional backing layer (not shown) may be provided for supporting the electrically-conductive fabric 32 immersed with the adhesive layer 24.

In some example embodiments, the electrically conductive fabric layer 32 may include a metal coated textile material (e.g., a fabric, etc.) such as, for example, nylon ripstop (NRS) material, a polyester material, a cotton material, a combination thereof, etc. that is coated (e.g., plated, etc.) with nickel, copper, a combination thereof, etc. Thus, in some of these example embodiments, the electrically conductive layer 32 may include a plated conductive fabric.

Various embodiments are described herein that include electrically conductive fabric. But other or additional materials, which may be non-fabric materials, may be used for the electrically conductive layer 32, provided that the application of a fire-retardant carbon-containing coating (such as the coating 36) to such materials can provide acceptable flame retardance as described herein. Such materials may include, e.g., metallic foils (e.g., aluminum foil, etc.), metal-coated plastic films (e.g., aluminum foil and polyester films, aluminum foil and polyethylene terephthalate laminates, etc.), other materials disclosed hereinafter, etc.

In some example embodiments, the electrically conductive fabric layer 32 may be provided (e.g., laminated, coated, impregnated, mixed, plated, vapor deposited, fabricated, formed, combinations thereof, etc.) with the coating 36, which performs as a halogen-free flame retardant. In various aspects, the coating 36 includes a halogen-free flame retardant carbon-containing resin.

Some exemplary embodiments include only components, e.g., flame retardants, that are halogen free as defined by industry standards. Accordingly, example embodiments of the flame retardant, electrically conductive adhesive materials disclosed herein may be considered environmentally friendly and viewed as halogen-free per the industry standards. For example, some example embodiments herein may be viewed as halogen-free per International Electrotechnical Commission (IEC) International Standard IEC 61249-2-21 (page 15, November 2003, First Edition). International Standard IEC 61249-2-21 defines "halogen free" (or free of halogen) for Electrical and Electronic Equipment Covered Under the European Union's Restriction of Hazardous Substances (RoHS) directive as having no more than a maximum of 900 parts per million chlorine, no more than a maximum of 900 parts per million bromine, and no more than a maximum of 1,500 parts per million total halogens. The phrases "halogen free," "free of halogen," and the like are similarly used herein.

Coatings may be used, however, that do not necessarily contain carbon. Coatings could be used, e.g., that have some kind of resin treatment and may include, e.g., inorganic and/or organic pigments and additives, etc. Resins may include, e.g., acrylic-based resins, urethane-based resins, polyester-based resins, etc. In various embodiments, a thickness of the coating 36 may vary. In some example embodiments, the thickness of the coating 36 can vary across the area of the fabric layer 32. Alternatively, the thickness of the coating 36 can be substantially uniform across the fabric layer 32. To help maintain electrical conductivity, the electrically conductive fabric 32 may not be entirely permeated or encapsulated with the coating 36 in some embodiments.

Various embodiments provide electrically conductive, adhesive materials as disclosed herein that are capable of successfully satisfying the flame-rating test outlined by the Underwriters Laboratories (UL) Standard No. 510, "Polyvinyl Chloride, Polyethylene, and Rubber Insulating Tape." By way of background, the UL510 standard covers thermoplastic and rubber tapes for use as electrical insulation at not more than six hundred volts and at eighty degrees Celsius (one hundred seventy-six degrees Fahrenheit) and at lower temperatures on joints and splices in wires and cables. The flame test calls for a gas flame to be applied to a test sample, which is kept in the flame for five 15-second applications. In order to be marked "flame retardant" under UL510, the tape must not flame longer than 60 seconds following any of the fifteen-second applications of the test flame. In some exemplary embodiments, a coating, e.g., the coating 36 as previously described that includes a carbon-containing resin, can perform effectively as the sole flame retardant included in an electrically conductive, adhesive material so as to satisfy the UL510 flame rating test.

EXAMPLES

The following examples are merely illustrative, and are not limiting to the disclosure in any way.

Example 1

In one example, an electrically conductive pressure sensitive adhesive material was made from thin, electrically conductive polyester taffeta fabric having a thickness of 0.1 millimeters and that was plated with nickel and copper. The fabric did not have a resin coating. An acrylic-based pressure sensitive adhesive having a thickness of 0.055 millimeter was laminated to the fabric. The pressure sensitive adhesive was a CPSA, 30 percent of which was an ammonium-polyphosphate-based flame retardant additive. Four samples of the material were tested in accordance with the UL510 flame test standard procedure. Results of the testing are shown in Table 1.

TABLE 1

| Sample | t1(s) | t2(s) | t3(s) | t4(s) | t5(s) | Evaluation |
|---|---|---|---|---|---|---|
| 1 | 0.00 | 29.40 | 3.42 | 1.95 | 0.00 | Pass |
| 2 | 0.00 | 26.72 | 4.48 | 2.42 | 0.00 | Pass |
| 3 | 0.00 | 26.6 | 7.38 | 2.71 | 0.00 | Pass |
| 4 | 0.00 | 27.42 | 2.49 | 3.89 | 3.17 | Pass |

Example 2

In another example, an electrically conductive pressure sensitive adhesive material was made from an electrically conductive polyester taffeta fabric having a thickness of 0.1 millimeters and that was plated with nickel and copper. The fabric did not have a resin coating. A pressure sensitive adhesive having a thickness of 0.055 millimeter was laminated to the fabric. The pressure sensitive adhesive was a CPSA, 30 percent of which was an ammonium-polyphosphate-based flame retardant additive. Three samples of the resulting material were tested in accordance with the UL510 flame test standard. Results of the testing are shown in Table 2.

TABLE 2

| Sample | t1(s) | t2(s) | t3(s) | t4(s) | t5(s) | Evaluation |
|---|---|---|---|---|---|---|
| 1 | 0.00 | >90.00 | / | / | / | Fail |
| 2 | 0.00 | 31.22 | 2.64 | 0.00 | 0.00 | Pass |
| 3 | 0.00 | >90.00 | / | / | / | Fail |

Example 3

In another example, an electrically conductive pressure sensitive adhesive material was made from a thin, electrically conductive polyester taffeta fabric having a thickness of 0.1 millimeters and that was plated with nickel and copper. The fabric did not have a resin coating. An acrylic-based pressure sensitive adhesive having a thickness of 0.055 millimeter was laminated to the fabric. The pressure sensitive adhesive was a CPSA, 16 percent of which was an ammonium-polyphosphate-based flame retardant additive. Three samples of the resulting material were tested in accordance with the UL510 flame test standard. Results of the testing are shown in Table 3.

TABLE 3

| Sample | t1(s) | t2(s) | t3(s) | t4(s) | t5(s) | Evaluation |
|---|---|---|---|---|---|---|
| 1 | 48.57 | 2.60 | 2.32 | 1.02 | 0.00 | Pass |
| 2 | >90 | / | / | / | / | Fail |
| 3 | >90 | / | / | / | / | Fail |

Example 4

In another example, an electrically conductive pressure sensitive adhesive material was made from an electrically conductive polyester taffeta fabric that was plated with nickel and copper. The fabric had a thickness of 0.1 millimeters and did not have a resin coating. An acrylic-based pressure sensitive adhesive having a thickness of 0.055 millimeter was laminated to the fabric. The pressure sensitive adhesive was a CPSA, 16 percent of which was an ammonium-polyphosphate-based flame retardant additive. Three samples of the resulting material were tested in accordance with the UL510 flame test standard. Results of the testing are shown in Table 4.

TABLE 4

| Sample | t1(s) | t2(s) | t3(s) | t4(s) | t5(s) | Evaluation |
|---|---|---|---|---|---|---|
| 1 | 17.89 | 44.71 | 1.33 | 0.00 | 0.00 | Pass |
| 2 | 8.22 | 21.22 | 4.31 | 1.22 | 0.00 | Pass |
| 3 | 39.14 | 5.55 | 2.44 | 0.00 | 0.00 | Pass |

Example 5

In a fifth example, an electrically conductive pressure sensitive adhesive material was made from an electrically conductive polyester taffeta fabric that was plated with nickel and copper and that had a thickness of 0.085 millimeters. The fabric was laminated with a 0.003-millimeter thick carbon-containing urethane-based resin coating. The coating contained between 40 and 60 percent polyurethane resin, between 60 and 40 percent carbon, and less than 1 percent additives. An acrylic-based pressure sensitive adhesive having a thickness of 0.055 millimeter was laminated to the fabric. The pressure sensitive adhesive was a CPSA, 16 percent of which was an ammonium-polyphosphate-based flame retardant additive. Five samples of the resulting material were tested in accordance with the UL510 flame test standard. Results of the testing are shown in Table 5.

TABLE 5

| Sample | t1(s) | t2(s) | t3(s) | t4(s) | t5(s) | Evaluation |
| --- | --- | --- | --- | --- | --- | --- |
| 1 | 5.39 | 4.93 | 3.96 | 5.28 | 0.00 | Pass |
| 2 | 2.60 | 3.49 | 3.49 | 5.58 | 0.00 | Pass |
| 3 | 2.94 | 5.35 | 3.64 | 3.24 | 0.00 | Pass |
| 4 | 3.83 | 3.19 | 5.08 | 5.95 | 0.00 | Pass |
| 5 | 12.82 | 2.22 | 10.07 | 5.32 | 0.00 | Pass |

Example 6

In another example, an electrically conductive polyester taffeta fabric that was plated with nickel and copper and that had a thickness of 0.050 millimeters was laminated with a 0.003-millimeter thick carbon-containing urethane-based resin coating. The coating contained between 40 and 60 percent polyurethane resin, between 60 and 40 percent carbon, and less than 1 percent additives. An acrylic-based pressure sensitive adhesive having a thickness of 0.055 millimeter was laminated to the fabric. The pressure sensitive adhesive was a CPSA, 16 percent of which was an ammonium-polyphosphate-based flame retardant additive. Three samples of the resulting material were tested in accordance with the UL510 flame test standard. Results of the testing are shown in Table 6.

TABLE 6

| Sample | t1(s) | t2(s) | t3(s) | t4(s) | t5(s) | Evaluation |
| --- | --- | --- | --- | --- | --- | --- |
| 1 | 2.71 | 3.10 | 7.19 | 3.35 | 0.00 | Pass |
| 2 | 1.67 | 2.50 | 4.35 | 0.00 | 0.00 | Pass |
| 3 | 2.90 | 6.10 | 4.66 | 0.00 | 0.00 | Pass |

Example 7

In a seventh example, an electrically conductive polyester taffeta fabric that was plated with nickel and copper and that had a thickness of 0.050 millimeters was laminated with a 0.003-millimeter thick carbon-containing urethane-based resin coating. The coating contained between about 40 and 60 percent polyurethane resin, between about 60 and 40 percent carbon, and less than 1 percent additives. A pressure sensitive adhesive was laminated onto the coated fabric. The pressure sensitive adhesive contained between about 2 and 20 percent nickel graphite powder by weight. No flame retardant was added to the pressure sensitive adhesive. Six samples of the resulting material were tested in accordance with the UL510 flame test standard. Results of the testing are shown in Table 7 and in FIGS. 2A and 2B.

TABLE 7

| Sample | t1(s) | t2(s) | t3(s) | t4(s) | t5(s) | Evaluation |
| --- | --- | --- | --- | --- | --- | --- |
| 1 | 14.93 | 1.60 | 0.00 | 0.00 | 0.00 | Pass |
| 2 | 46.60 | 1.22 | 0.00 | 0.00 | 0.00 | Pass |
| 3 | 9.61 | 1.83 | 0.00 | 0.00 | 0.00 | Pass |
| 4 | 55.65 | 0.00 | 0.00 | 0.00 | 0.00 | Pass |
| 5 | 7.98 | 1.74 | 0.00 | 0.00 | 0.00 | Pass |
| 6 | 5.69 | 2.41 | 3.53 | 0.00 | 0.00 | Pass |

Figure 2A:
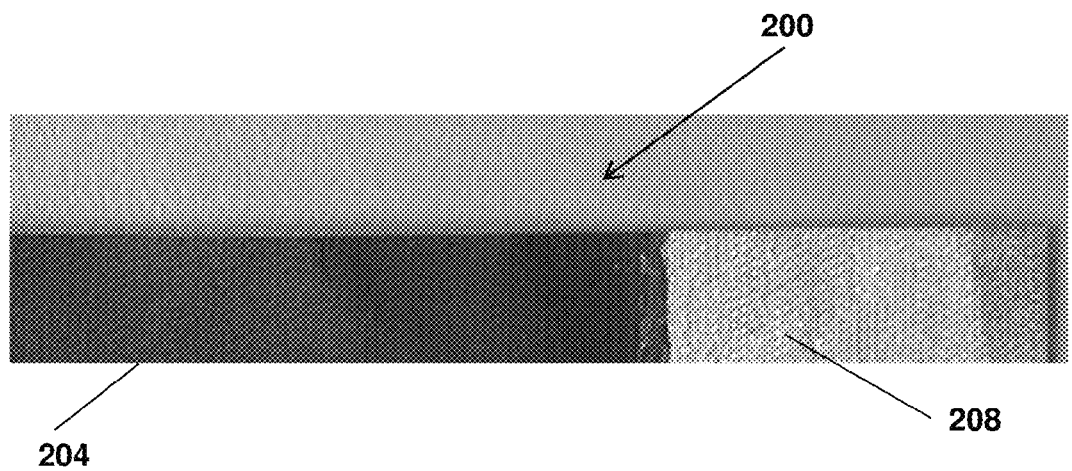
FIG. 2A is an illustration of a test sample of an exemplary embodiment of a flame retardant, electrically conductive adhesive material, before being flame tested in accordance with UL510 standard.
Figure 2B:
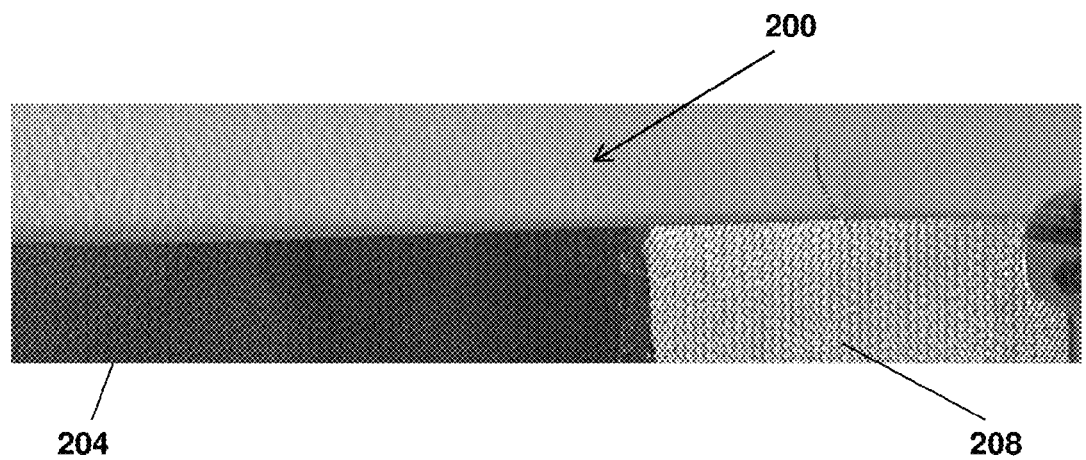
FIG. 2B is an illustration of the test sample shown in FIG. 2A, after being flame tested in accordance with UL510 standard.

FIGS. 2A and 2B illustrate a sample 200, i.e., one of the samples flame-tested as described in Example 7. A fabric portion 204 was coated with the foregoing carbon-containing resin coating and an adjacent portion 208 was left exposed. FIG. 2A shows the sample 200 before flame testing was performed on the coated fabric portion 204. FIG. 2B illustrates the test sample 200 after the flame testing was performed. The coated portion 204 remained sufficiently intact throughout the testing to provide flame retardance in accordance with the UL510 standard.

Example 8

In an eighth example, an electrically conductive polyester taffeta fabric that was plated with nickel and copper and that had a thickness of 0.050 millimeters was laminated with a 0.8-millimeter thick carbon-containing urethane-based resin coating. The coating had a weight pickup of between about 7 and 10 grams per square meter. A pressure sensitive adhesive was laminated onto the coated fabric. The pressure sensitive adhesive contained between about 2 and 20 percent nickel graphite powder by weight. No flame retardant was added to the pressure sensitive adhesive. Three samples of the resulting material were tested in accordance with the UL510 flame test standard. Results of the testing are shown in Table 8.

TABLE 8

| Sample | t1(s) | t2(s) | t3(s) | t4(s) | t5(s) | Evaluation |
| --- | --- | --- | --- | --- | --- | --- |
| 1 | 3.27 | 1.83 | 5.8 | 0.00 | 0.00 | Pass |
| 2 | 32.56 | 10.88 | 10.91 | 0.00 | 0.00 | Pass |
| 3 | 4.66 | 1.23 | 5.42 | 0.00 | 0.00 | Pass |

Example 9

In a ninth example, an electrically conductive polyester taffeta fabric that was nickel-plated and copper-plated and that had a thickness of 0.050 millimeters was laminated with a 0.8-millimeter thick carbon-containing urethane-based resin coating. The coating had a weight pickup of between about 7 and 10 grams per square meter. A pressure sensitive adhesive was laminated onto the coated fabric. The pressure sensitive adhesive contained between about 2 and 20 percent nickel graphite powder by weight. No flame retardant was added to the pressure sensitive adhesive. Three samples of the resulting material were tested in accordance with the UL510 flame test standard. Results of the testing are shown in Table 9.

TABLE 9

| Sample | t1(s) | t2(s) | t3(s) | t4(s) | t5(s) | Evaluation |
|---|---|---|---|---|---|---|
| 1 | 6.19 | 4.11 | 4.93 | 0.00 | 0.00 | Pass |
| 2 | 4.60 | 3.80 | 3.21 | 0.00 | 0.00 | Pass |
| 3 | 3.56 | 2.38 | 4.49 | 0.00 | 0.00 | Pass |

Example 10

In a tenth example, an electrically conductive polyester taffeta fabric that was nickel- and copper-plated and that had a thickness of 0.050 millimeters was laminated with a 0.8-millimeter thick carbon-containing urethane-based resin coating. The coating had a weight pickup of between about 7 and 10 grams per square meter. A pressure sensitive adhesive was laminated onto the coated fabric. The pressure sensitive adhesive contained between about 2 and 20 percent nickel graphite powder by weight. No flame retardant was added to the pressure sensitive adhesive. Three samples of the resulting material were tested in accordance with the UL510 flame test standard. Results of the testing are shown in Table 10.

TABLE 10

| Sample | t1(s) | t2(s) | t3(s) | t4(s) | t5(s) | Evaluation |
|---|---|---|---|---|---|---|
| 1 | 6.64 | 2.01 | 10.81 | 0.00 | 0.00 | Pass |
| 2 | 3.86 | 1.39 | 12.28 | 0.00 | 0.00 | Pass |
| 3 | 5.66 | 2.18 | 26.80 | 0.00 | 0.00 | Pass |

Example 11

In an eleventh example, an electrically conductive polyester taffeta fabric that was nickel- and copper-plated and that had a thickness of 0.050 millimeters was laminated with a 0.2-millimeter thick carbon-containing urethane-based resin coating. The coating had a weight pickup of between about 3 and 5 grams per square meter. A pressure sensitive adhesive was laminated onto the coated fabric. The pressure sensitive adhesive contained between about 2 and 20 percent nickel graphite powder by weight. No flame retardant was added to the pressure sensitive adhesive. Three samples of the resulting material were tested in accordance with the UL510 flame test standard. The samples ignited the paper flag of the testing structure. Results of the testing are shown in Table 11.

TABLE 11

| Sample | t1(s) | t2(s) | t3(s) | t4(s) | t5(s) | Evaluation |
|---|---|---|---|---|---|---|
| 1 | 3.35 | 27.14 | / | / | / | Fail |
| 2 | 56.70 | / | / | / | / | Fail |
| 3 | 37.78 | / | / | / | / | Fail |

Further testing was performed, results of which are summarized below.

Example 12

A sample was formed by laminating an electrically conductive, nickel- and copper-plated, 0.050 millimeter-thick polyester taffeta with a urethane-based, carbon-containing resin coating having a thickness of 0.2 millimeters. The resin coating also included an amount of fire retardant. A pressure sensitive adhesive was laminated onto the coated fabric. The pressure sensitive adhesive contained between about 2 and 20 percent nickel graphite powder by weight. No flame retardant was added to the pressure sensitive adhesive. The sample remained sufficiently intact throughout the testing to provide flame retardance in accordance with the UL510 standard.

Example 13

A sample was formed by laminating an electrically conductive, nickel- and copper-plated, 0.050 millimeter-thick polyester taffeta with a urethane-based, carbon-containing resin coating having a thickness of 0.2 millimeters. There was no additional fire retardant in the resin. A pressure sensitive adhesive was laminated onto the coated fabric. The pressure sensitive adhesive contained between about 2 and 20 percent nickel graphite powder by weight. The sample failed to provide flame retardance in accordance with the UL510 standard.

Example 14

A sample was formed by laminating an electrically conductive, nickel- and copper-plated, 0.050 millimeter-thick polyester taffeta with a urethane-based, carbon-containing resin coating having a thickness of 0.8 millimeters. There was no additional fire retardant in the resin. A pressure sensitive adhesive was laminated onto the coated fabric. The pressure sensitive adhesive contained between about 2 and 20 percent nickel graphite powder by weight. The sample remained sufficiently intact throughout the testing to provide flame retardance in accordance with the UL510 standard.

The foregoing test results show that providing a carbon-containing coating as a flame retardant can reduce or eliminate a percentage of flame retardant that otherwise would be added into the adhesive to make flame retardant, electrically conductive adhesive materials. Tapes that incorporate exemplary embodiments of the flame retardant, electrically conductive adhesive materials can be advantageously thin while exhibiting high adhesion. Further, the costs of adding flame retardant to adhesive can be eliminated or reduced, thus making it possible to provide electrically conductive tape and other products less expensively.

Advantageously, using embodiments of the foregoing coating to replace or at least reduce the use of flame retardant in adhesive can result, e.g., in electrically conductive tapes that exhibit high peel adhesion or bond strength. By not using flame retardants in the adhesive, some exemplary embodiments have a peel strength or peel adhesion that is higher than electrically conductive pressure sensitive adhesives that contain flame retardants loaded in the adhesive. Some exemplary embodiments have a peel strength or peel adhesion that is similar to or equal to non-flame retardant tape. By way of example, exemplary embodiments disclosed herein may have a peel adhesion of at least 1.6 pounds per inch width or 25.6 ounces per inch width or higher as determined by a 180 degree peel test, such as a peel adhesion of about 28 ounces per inch width or that falls within a range from about 36 ounces per inch width to about 40 ounces per inch width. Additionally, exemplary embodiments of the foregoing coating tend not to interfere with EMI shielding effectiveness, and so a product in which such coating is used typically has good EMI shielding properties compared to shielding properties of some products containing flame retardants other than the foregoing coating.

Thus, various example embodiments are described as follows. In a first example embodiment, a flame retardant, electrically conductive adhesive material suitable for use as tape comprises: a layer of electrically conductive adhesive; a layer of electrically conductive fabric on the layer of electrically conductive adhesive; and a flame retardant coating provided on the layer of electrically conductive fabric, the coating including a carbon-containing resin.

In a second example embodiment, a flame retardant, electrically conductive adhesive material suitable for use as tape comprises: a layer of pressure sensitive adhesive; a layer of electrically conductive fabric on the layer of pressure sensitive adhesive; and a carbon-containing resin in a coating provided on the fabric.

In a third example embodiment, a method of making a flame retardant, electrically conductive adhesive material suitable for use as tape comprises: coating a first side of a layer of an electrically conductive fabric with a carbon-containing resin coating; and applying a layer of adhesive to a second side of the layer of the electrically conductive fabric.

In a fourth example embodiment, a flame retardant, electrically conductive tape having a UL 510 flame rating generally includes an electrically conductive fabric having first and second sides. A flame retardant carbon-containing resin is on the first side of the electrically conductive fabric. An electrically conductive, pressure sensitive adhesive is on the second side of the electrically conductive fabric.

In the first, second, third, and/or fourth example embodiments, the adhesive may be free of flame retardants.

In the first, second, third, and/or fourth example embodiments, the adhesive may be a pressure sensitive adhesive.

In the first, second, third, and/or fourth example embodiments, the adhesive may be electrically conductive.

Various exemplary embodiments are directed to a tape made of adhesive material as described in the first and/or second example embodiments and/or using the method described in the third example embodiment.

In the first, second, third, and/or fourth example embodiments, the fabric may have a thickness of between 0.01 millimeter and 1 millimeter (e.g., 0.01 mm, 0.5 mm, 1 mm, etc.). In the first, second, third, and/or fourth example embodiments, the adhesive may have a thickness of between 0.01 millimeter and 0.2 millimeter (e.g., 0.01 mm, 0.1 mm, 0.2 mm, etc.). In the first, second, third, and/or fourth example embodiments, the first, second, and/or third example embodiments, the coating may have a thickness of between 0.2 millimeters and 2 millimeters (e.g., a coating thickness of 0.2, mm, 0.8 mm, 2 mm, etc.). The thicknesses and thicknesses ranges (as are all dimensions and ranges) provided herein are example in nature and do not limit the scope of the present disclosure.

In another embodiment, the disclosure is directed to coating a carbon-containing resin in the top of the fabric, and then laminating with pressure sensitive adhesive. The carbon-containing coating may reduce the percentage of flame retardant added into the pressure sensitive adhesive a lot and increase the performance of the end product.

The foregoing tests show, e.g., that a 0.8 mm thickness of carbon-containing resin coating fabric laminated with a non-flame retardant pressure sensitive adhesive can pass UL510FR. Usually, a conventional flame retardant conductive fabric tape is composed of a conductive fabric layer and pressure sensitive adhesive. The pressure sensitive adhesive may have some additional flame retardant to make the tape pass UL510 FR grade. The flame retardant added in the conventional pressure sensitive adhesive often can make the performance such as adhesion or electrical conductivity worse. Various embodiments of the present disclosure may improve the adhesion of UL510FR grade conductive fabric tape, offer black color product, and also have good electrical conductivity as well. Exemplary embodiments are disclosed of flame retardant, electrically conductive tapes having a UL 510 flame rating and that also have good adhesion and good electrical conductivity. For example, an exemplary embodiment of a flame retardant, electrically conductive tape may exhibit z-axis conductivity or bulk resistivity suitable for electromagnetic shielding applications, have a z-axis resistance of 0.009 ohms or less (e.g., 0.007 ohms, etc.) and/or a surface resistivity of 0.07 ohms per square or less (e.g., 0.02 ohms per square, etc.), etc. Also by way of example, an exemplary embodiment of a flame retardant, electrically conductive tape may good adhesion, e.g., a peel strength or peel adhesion of at least 1.6 pounds per inch width (25.6 ounces per inch width) or higher as determined by a 180 degree peel test, etc. In an exemplary embodiment, a flame retardant, electrically conductive tape has a peel strength of about 28 ounces per inch width. In another exemplary embodiment, a flame retardant, electrically conductive tape has a peel strength or peel adhesion within a range of about 36 ounces per inch width to about 40 ounces per inch width (e.g., a peel strength of 36, 37, 38, 39, or 40 ounces per inch width, etc.).

In one particular embodiment, there is a flame retardant, electrically conductive adhesive material suitable for use as tape. The adhesive material includes electrically conductive adhesive, electrically conductive fabric laminated on the layer of electrically conductive adhesive, and a flame retardant coating on the electrically conductive fabric. The coating includes a carbon-containing resin and was 0.3 mm thick. Continuing with this example, this exemplary embodiment has a z-axis resistance of 0.007 ohms, a surface resistivity of 0.02 ohms per square, and a peel strength or peel adhesion within a range of about 36 ounces per inch width to about 40 ounces per inch width.

In various embodiments in which a carbon-containing coating is provided, fire retardant in the PSA is not required. This can be advantageous, in that fire retardant in PSA tends to reduce peel adhesion or peel strength. In various embodiments, a carbon-containing coating does not affect shielding effectiveness as much as fire retardant would, so a resulting product can have good EMI shielding properties.

As used herein, the term "layer" or "layers" (e.g., CPSA layer, fabric layer, etc.) is not intended to limit the description to any particular set forms, shapes, or configurations. It is instead done to distinguish different features of the adhesive material. Therefore, the terms "layer" or "layers" should not be read as limitations herein. In addition, the terms "fire resistant", "fire retardant", "flame resistant", and "flame retardant" are used interchangeably herein. These terms are intended to have corresponding meanings, and use of one instead of the other is not intended as a limitation.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). Similarly, it is envisioned that disclosure of two or more ranges of values for a parameter (whether such ranges are nested, overlapping or distinct) subsume all possible combination of ranges for the value that might be claimed using endpoints of the disclosed ranges.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A flame retardant, electrically conductive adhesive material suitable for use as tape and comprising:
   a layer of electrically conductive adhesive that is free of flame retardant;
   a layer of electrically conductive fabric on the layer of electrically conductive adhesive; and
   a flame retardant coating on the layer of electrically conductive fabric, the coating including a carbon-containing resin;
   wherein the flame retardant, electrically conductive adhesive material is able to achieve a UL flame rating; and
   wherein:

the flame retardant coating including the carbon-containing resin is the sole flame retardant included in the flame retardant, electrically conductive adhesive material; and/or the flame retardant, electrically conductive adhesive material has a z-axis resistance of 0.007 ohms or less, and/or a surface resistivity of 0.07 ohms per square or less, and/or a peel adhesion of at least 1.6 pounds per inch width or higher.

2. The adhesive material of claim 1, wherein:

wherein the flame retardant, electrically conductive adhesive material has a z-axis resistance of 0.007 ohms or less, and/or a surface resistivity of 0.07 ohms per square or less, and/or a peel adhesion of at least 1.6 pounds per inch width or higher; and the flame retardant coating including the carbon-containing resin is the sole flame retardant included in the flame retardant, electrically conductive adhesive material; and the flame retardant, electrically conductive adhesive material is able to achieve a flame rating of UL510.

3. The adhesive material of claim 1, wherein the flame retardant, electrically conductive adhesive material is able to achieve a flame rating of UL510.

4. A flame retardant, electrically conductive adhesive material suitable for use as tape and comprising:

a layer of pressure sensitive adhesive that is free of flame retardant;

a layer of electrically conductive fabric on the layer of pressure sensitive adhesive; and a carbon-containing resin in a coating on the layer of electrically conductive fabric;

wherein the carbon-containing resin provides sufficient flame retardance such that the flame retardant, electrically conductive adhesive material is able to achieve a UL flame rating; and wherein the carbon-containing resin is the sole flame retardant included in the flame retardant, electrically conductive adhesive material.

5. A flame retardant, electrically conductive adhesive material suitable for use as tape and comprising:

a layer of pressure sensitive adhesive that is free of flame retardant;

a layer of electrically conductive fabric on the layer of pressure sensitive adhesive; and a carbon-containing resin in a coating on the layer of electrically conductive fabric;

wherein the carbon-containing resin provides sufficient flame retardance such that the flame retardant, electrically conductive adhesive material is able to achieve a UL flame rating; and wherein the flame retardant, electrically conductive adhesive material has a z-axis resistance of 0.007 ohms or less, and/or a surface resistivity of 0.07 ohms per square or less, and/or a peel adhesion of at least 1.6 pounds per inch width or higher.

6. A flame retardant, electrically conductive adhesive material suitable for use as tape and comprising:

a layer of pressure sensitive adhesive that is free of flame retardant;

a layer of electrically conductive fabric on the layer of pressure sensitive adhesive; and a carbon-containing resin in a coating on the layer of electrically conductive fabric;

wherein the carbon-containing resin provides sufficient flame retardance such that the flame retardant, electrically conductive adhesive material is able to achieve a UL flame rating; and wherein the flame retardant, electrically conductive adhesive material is able to achieve a flame rating of UL510.

7. The adhesive material of claim 6, wherein the carbon-containing resin is the sole flame retardant included in the flame retardant, electrically conductive adhesive material.

8. A tape comprising a flame retardant, electrically conductive adhesive material that comprises:

a layer of electrically conductive adhesive that is free of flame retardant;

a layer of electrically conductive fabric on the layer of electrically conductive adhesive; and a flame retardant coating on the layer of electrically conductive fabric, the coating including a carbon-containing resin;

wherein the tape is able to achieve a UL flame rating; and wherein the tape has no more than a maximum of 900 parts per million chlorine, no more than a maximum of 900 parts per million bromine, and no more than a maximum of 1,500 parts per million total halogens; and wherein the tape has a surface resistivity of 0.07 ohms per square or less and/or a peel adhesion of at least 1.6 pounds per inch width or higher.

9. The tape of claim 8, wherein the carbon-containing resin is the sole flame retardant included in the flame retardant, electrically conductive adhesive material.

10. The tape of claim 8, wherein the tape is able to achieve a flame rating of UL510.

11. A flame retardant, electrically conductive tape comprising:

an electrically conductive fabric having first and second sides;

a flame retardant carbon-containing resin on the first side of the electrically conductive fabric; and an electrically conductive, pressure sensitive adhesive that is free of flame retardant on the second side of the electrically conductive fabric;

wherein the flame retardant carbon-containing resin provides sufficient flame retardance such that the tape is able to achieve a UL flame rating; and wherein the flame retardant carbon-containing resin is the sole flame retardant included in the tape.

12. The tape of claim 11, wherein the tape has no more than a maximum of 900 parts per million chlorine, no more than a maximum of 900 parts per million bromine, and no more than a maximum of 1,500 parts per million total halogens.

13. A flame retardant, electrically conductive tape comprising:

an electrically conductive fabric having first and second sides;

a flame retardant carbon-containing resin on the first side of the electrically conductive fabric; and an electrically conductive, pressure sensitive adhesive that is free of flame retardant on the second side of the electrically conductive fabric;

wherein the flame retardant carbon-containing resin provides sufficient flame retardance such that the tape is able to achieve a UL flame rating; and wherein the tape has a z-axis resistance of 0.007 ohms or less, and/or a surface resistivity of 0.07 ohms per square or less, and/or a peel adhesion within a range of 36 ounces per inch width to 40 ounces per inch width.

14. A flame retardant, electrically conductive tape comprising:
- an electrically conductive fabric having first and second sides;
- a flame retardant carbon-containing resin on the first side of the electrically conductive fabric; and
- an electrically conductive, pressure sensitive adhesive that is free of flame retardant on the second side of the electrically conductive fabric;
- wherein the flame retardant carbon-containing resin provides sufficient flame retardance such that the tape is able to achieve a UL flame rating; and
- wherein the tape is able to achieve a flame rating of UL510.

15. The tape of claim 14, wherein the flame retardant carbon-containing resin is the sole flame retardant included in the tape.

\* \* \* \* \*